United States Patent
Chauhan et al.

(10) Patent No.: US 7,199,613 B2
(45) Date of Patent: Apr. 3, 2007

(54) REDUCING COUPLING EFFECT ON REFERENCE VOLTAGES WHEN OUTPUT BUFFERS IMPLEMENTED WITH LOW VOLTAGE TRANSISTORS GENERATE HIGH VOLTAGE OUTPUT SIGNALS

(75) Inventors: Rajat Chauhan, Dehradun (IN); Karthik G Rajagopal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 191 days.

(21) Appl. No.: 10/710,874

(22) Filed: Aug. 10, 2004

(65) Prior Publication Data

US 2006/0033529 A1    Feb. 16, 2006

(51) Int. Cl.
*H03K 19/0175* (2006.01)
(52) U.S. Cl. .............................. 326/81; 326/68; 326/80
(58) Field of Classification Search .................. 326/68, 326/80–81, 82–83; 327/108–112
See application file for complete search history.

(56) References Cited

U.S. PATENT DOCUMENTS

| | | |
|---|---|---|
| 4,704,547 A | 11/1987 | Kirsch |
| 5,969,542 A * | 10/1999 | Maley et al. .................. 326/81 |
| 6,218,854 B1 * | 4/2001 | Ko ................................ 326/30 |
| 6,392,439 B2 * | 5/2002 | Tanaka et al. ................ 326/68 |
| 6,556,040 B2 * | 4/2003 | Whitworth ..................... 326/30 |

OTHER PUBLICATIONS

Hector Sanchez, Joshua Siegel, Carmine Nicoletta, James .P and Nissen ,Jose Alvarez, "A Versatile 3.3V/2.5V/1.8-V CMOS I/O Driver Built in a 0.2-um , 3.5nm Toz, 1.8-V CMOS Technology" In IEEE J. Solid State Circuits vol. 34,pp. 1501-1511,No. 11, Nov. 1999.
Changsik Yoo, Min-Kyu Kim, and Wonchan kim , "A Static Power Saving TTL-to-CMOS Input buffer" in IEEE Journal of Solid State Circuits. vol. 30, pp. 616-620, No. 5, May 1995.

* cited by examiner

*Primary Examiner*—Anh Q. Tran
(74) *Attorney, Agent, or Firm*—Alan K. Stewart; W. James Brady; Frederick J. Telecky, Jr.

(57) ABSTRACT

Reducing the effect of coupling on a reference voltage received at a node of an output buffer, wherein the effect of coupling is due to the transitions in the output signals. An inverted signal of the output signal is connected to the node through an impedance (e.g., capacitor) that stores energy. The inverted signal pulls the node in the opposite voltage level direction compared to the coupling effect of the output signal, thereby leaving the reference voltage substantially unchanged. By selecting the capacitance of the capacitor equaling the parasitic capacitance between the node and the output of the output buffer, coupling may be reduced substantially.

12 Claims, 6 Drawing Sheets

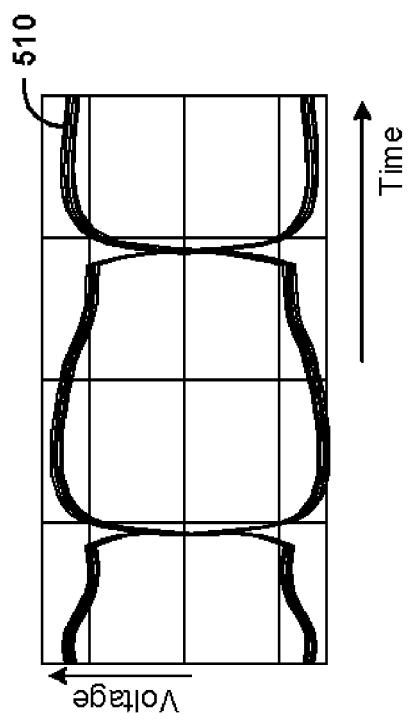
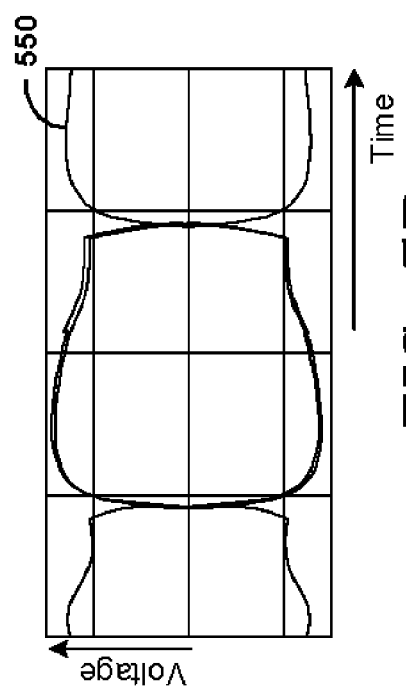
FIG. 5A (Prior Art)
FIG. 5B

REDUCING COUPLING EFFECT ON REFERENCE VOLTAGES WHEN OUTPUT BUFFERS IMPLEMENTED WITH LOW VOLTAGE TRANSISTORS GENERATE HIGH VOLTAGE OUTPUT SIGNALS

BACKGROUND OF INVENTION

1. Field of the Invention

The present invention relates to the design of integrated circuits, and more specifically to a method and apparatus to reduce coupling effect on reference voltages when output buffers implemented with low voltage transistors generate high voltage output signals.

2. Related Art

Output buffers are often used in integrated circuits to drive external device/load (e.g., another integrated circuit) based on data received from another source. In general, output buffers need to generate output signals to drive external devices with suitable voltage levels compatible with the specifications of external devices to ensure that the data is accurately transferred to the external devices. For example, if an external device is designed to receive input signals at +5 Volts, then output signals need to be at a maximum voltage of +5V.

Output buffers are generally implemented using transistors, which are characterized by associated maximum permissible cross terminal voltages, and such voltages are generally referred to as the voltage specification for the corresponding transistors. For example, it is generally desirable to keep the maximum cross terminal voltage of a 1.8V transistor below 1.8V, even though up to 2.4 V is often applied across the terminals of the 1.8V transistor, in which case there is some exposure to reducing the lifetime of the transistor, etc. The 2.4V limit may be referred to as allowed maximum voltage.

It is often desirable to implement output buffers generating high voltage output signals using transistors ("low voltage transistors") of low(er) voltage specification. In general, using low voltage transistors provides benefits such as high throughput performance, reduced electrical power consumption, lower number of fabrication masks (leading to lower fabrication costs) and high density (number of integrated circuits in a unit area). High voltage output signals may be required for conformance with the specifications of the external load/device.

In one prior embodiment implementing such an output buffer, a supply voltage (equaling the high voltage of the output signals) is applied to a low voltage transistor contained in the output buffer. A reference voltage is also applied to the low voltage transistor to prevent cross terminal voltages from exceeding the allowed maximum voltage. The reference voltage is less than the allowed maximum voltage and equals half of supply voltage in the embodiment.

One problem with such high voltage output buffers is the coupling (unwanted signal fed back from output to input) of the transitions in the high voltage output signals to the reference voltages through parasitic capacitors of the low voltage transistors. Such coupling effect may cause the voltage level of the reference voltages to exceed the corresponding allowed maximum voltage, which may reduce the life time of the low voltage transistors.

In addition, the variation in the voltage level of the reference voltage resulting from the voltage coupling, may alter the transistor behavior (in particular the effective resistance of the transistor), which results in jitter in the output signals. Furthermore, the output buffer may get stuck at one output value if the coupling voltage is too high causing the transistors to be completely turned off.

What is therefore needed is a method and apparatus to reduce coupling effect on reference voltages when output buffers implemented with low voltage transistors generate high voltage output signals.

BRIEF DESCRIPTION OF DRAWINGS

The present invention will be described with reference to the following accompanying drawings.

FIGS. 5A and 5B are timing diagrams respectively illustrating jitter in the output signals generated by a prior pad driver and a pad driver in an embodiment of the present invention.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

In an output buffer implemented with low(er) voltage transistors generating output signals of high voltage, an aspect of the present invention reduces the effect of coupling of transitions in the output signal to a node to which a reference voltage is applied. The reduction may be attained by connecting an inverted signal of the output signal to the same node via an impedance (capacitor or inductor) which can store energy. The signal provided to the node operates as a compensating signal which pulls the node in the opposite voltage level direction compared to the coupling effect of the output signal, thereby leaving the reference voltage substantially unchanged.

In an embodiment, the inverted signal is realized by an inverter based on the output signal of the output buffer. By selecting the capacitance of the capacitor equaling the parasitic capacitance between the node and the output of output buffer, the effect of voltage coupling may be reduced substantially. In addition, it was empirically recognised that the same circuit can be used for an output signal with a wide range of slew rates (the rate at which the output signal changes).

Various aspects of the present invention are described below with reference to an example problem. Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the invention.

2. Example Environment

Figure 1:
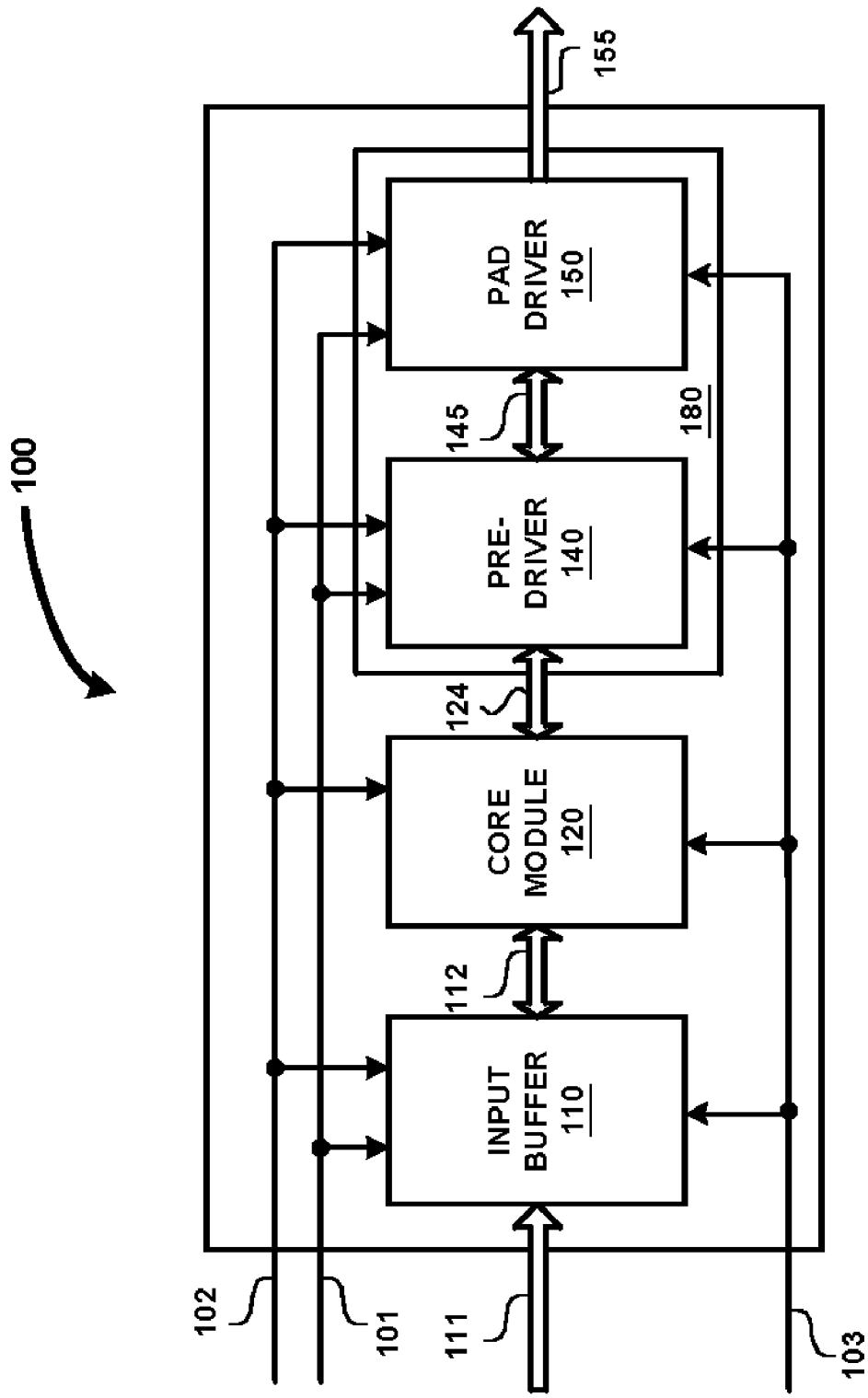
FIG. 1 is a block diagram illustrating an example environment in which several aspects of the present invention may be implemented.

FIG. 1 is a block diagram illustrating an example environment of an integrated circuit in which several aspects of the present invention may be implemented. Integrated circuit (IC 100) 100 is shown containing input buffer 110, core module 120, and output buffer 180. Each block is described below in further detail.

Broadly, input module 110, core module 120, and output buffer 180 are implemented with low voltage transistors (for high throughput performance), and output buffer 180 generates output signals on path 155 with a high voltage swing (e.g., for consistency with the signal specification of an external device). In the description herein, the voltage level (swing) of the output signals is conveniently referred to as a high voltage level and the voltage specification of the transistors as a low voltage level.

Input buffer 110 receives an input signal on path 111 and provides the received input signals on path 112 with a desired voltage level consistent with the requirements of core module 120. The same data (information in the case of analog signals) received in input signal, may be provided on 112. The signal can be received with a high or low voltage swing. Core module 120 performs various operations on data received on bus 112, and provides the resulting data with a low voltage swing on bus 124.

Output buffer 180 is shown containing pre-driver 140 and pad driver 150, which together operate to transfer the data received on path 124 to path 155, but with a desired specification consistent with the requirements on components connected to path 155. The components of output buffer 180 are described in further detail below.

Pre-driver 140 receives the data on bus 124, and generates input signals to pad driver 150 on bus 145. The input signals to pad driver 150 represent the inversion of data on bus 124, but with a desired voltage swing without altering the data in the signals. The desired swing is described below in further detail with reference to the details of pad driver 150.

Pad driver 150 generates output signals with a voltage level equaling the specifications of an external device/interface. The output signals are generated based on the input signals received on bus 145. The output signals are provided on path 155. The output signals on path 155 may represent the same bit values/data as that received on path 124.

Each of input buffer 110, pre-driver 140 and pad driver 150 receives high voltage supply HVDD and low voltage supply LVDD respectively on paths 101 and 102. Core module 120 receives LVDD 102. The voltage level of each of HVDD 101 and LVDD 102 is with respect to a ground voltage (Vss) received on path 103. In the present application, various embodiments are described assuming that the voltage level of HVDD 101 is greater than that of LVDD 102.

Pad driver 150 provides output signals with a desired voltage level consistent with the specifications of the external devices without exposing the transistors (in output buffers) to voltage levels exceeding the corresponding allowed maximum voltages. In addition, pad driver 150 reduces jitter in the output signals. An example embodiment of such a pad driver is described in sections below with reference to FIG. 3.

It may be helpful to first understand the details of a prior output buffer (pad driver), which does not include one or more features of the present invention. Accordingly, a prior pad driver in an output buffer is described below with reference to FIG. 2.

3. Prior Pad Driver in an Output Buffer

Figure 2:
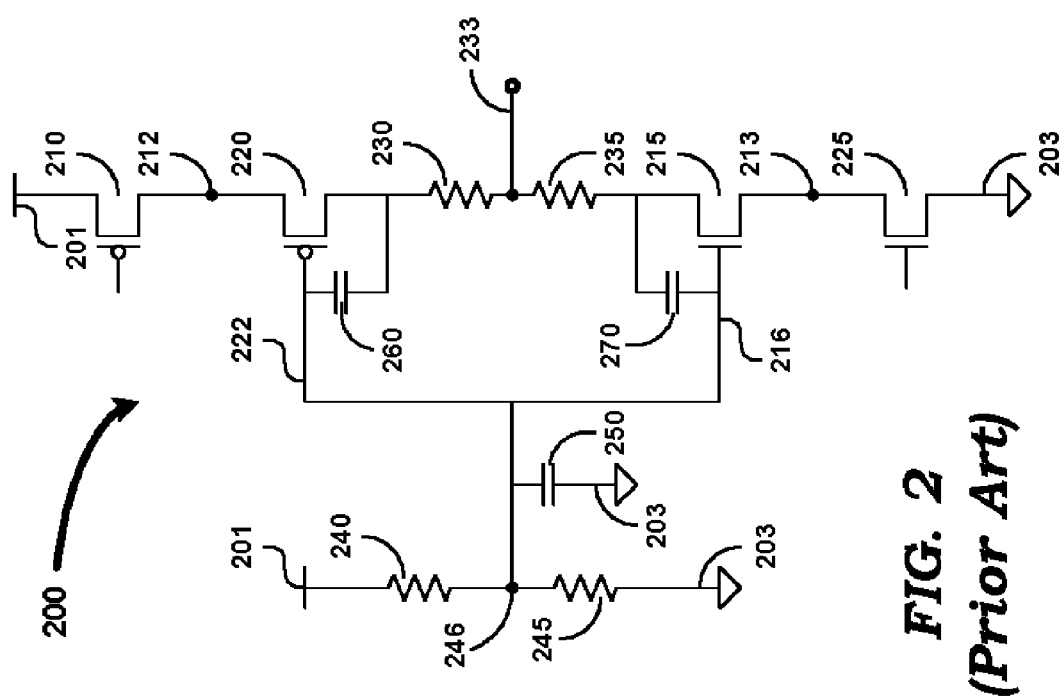
FIG. 2 is a circuit diagram illustrating the details of a pad driver in an output buffer in a prior embodiment.

FIG. 2 is a circuit diagram illustrating the details of a pad driver in an output buffer in a prior embodiment. Pad driver 200 is shown containing PMOS transistors 210 and 220, NMOS transistors 215 and 225, resistors 230, 235, 240 and 245 and capacitors 250, 260 and 270. Each component is described in detail below.

Transistors 210 and 225 together operate as an inverter. Transistor 210 receives high supply voltage on path 201 with reference to ground voltage Vss received on path 203. Transistor 225 receives ground/Vss 203 on the source terminal.

Each of transistors 210 and 225 receive input signals on respective gate terminals with a voltage swing lower than the voltage specification of the transistor. As a result, cross terminal voltage between gate and drain, and gate and source terminals of each transistor 210 and 225 may be prevented from exceeding the allowed maximum voltage. The drain to source terminal voltage of each transistor 210 and 225 may be prevented from exceeding the allowed maximum voltage using transistors 220 and 215 as described below.

Transistor 220 protects transistor 210 from exposure to high voltages. Transistor 220 receives a reference voltage (Vref) on gate terminal 222. Transistor 220 does not allow the voltage at node 212 from falling below (Vref+Vt of transistor 220) even if the voltage on output path 233 equals 0V. As a result, drain to source voltage of transistor 210 does not exceed the maximum allowed voltage.

Transistor 215 protects transistor 225 from exposure to high voltages by receiving a reference voltage (Vref) on gate terminal 216. Transistor 215 does not allow the voltage at node 213 from rising above (Vref−Vt of transistor 225) even if the voltage on path 233 equals high voltage. As a result, drain to source voltage of transistor 225 does not exceed the maximum allowed voltage.

Resistors 230 and 235 provide a linear current-voltage (IV) characteristics to the output buffer (pad driver), which reduces jitter and improves signal integrity. Resistors 240 and 245 operate as a potential divider network, which divides supply voltage 201 based on the ratio of the respective resistance values, to generate reference voltage Vref at node 246. The resistance of each of resistors 240 and 245 is selected as a large value to reduce static power dissipation. In an embodiment, resistance of resistors 240 and 245 is same, then the reference voltage Vref equals half of supply voltage. Vref is provided at node 246 and further provided on paths 222 and 216.

Parasitic capacitors 260 and 270 respectively represent the parasitic capacitance of transistors 220 and 215. Merely for illustration, the parasitic capacitances are shown with capacitors 260 and 270 even though no physical capacitor is present as parasitic capacitance.

Capacitors 260 and 270 respectively couple transitions in the output signal on path 233 to reference voltages on paths 222 and 216, which is undesirable. Such voltage coupling would be large if the capacitance of capacitors 260 and 270 is large. The parasitic capacitance is often large as the size of transistors 220 and 215 is selected to be large for fast switching (high throughput performance).

Due to such voltage coupling, the voltage level of Vref on paths 222 and 216 may not always equal the desired reference voltage. The variation in the voltage level on paths 222 and 216 may require extra current to be supplied by the potential divider network, otherwise, the voltage level of Vref 246 would decrease. However, the potential divider network cannot source or sink current due to the large impedance.

Capacitor 250 provides extra current to bring back the variation in the reference voltage on paths 222 and 216 to the original value. Capacitance of capacitor 250 needs to be larger than the capacitance of capacitors 260 and 270 such that the energy of capacitor 250 would be more than that of the parasitic capacitors 260 and 270. As a result, capacitor 250 does not allow the voltage on paths 222 and 216 to change from the desired voltage level. In an embodiment, capacitance of capacitor 250 equals 8 times the sum of the capacitances of capacitors 260 and 270.

One problem with such a pad driver is the large area requirement since the large capacitance value of capacitor 250 requires large area. In addition, the capacitance of capacitor 250 needs to be much larger for high(er) speed output buffers. If the output signals switch faster, then the capacitance of capacitor 250 needs to be large to provide high current. Therefore, the required capacitance value of capacitor 250 depends on the slew rate (switching speed) of the output signals, which implies that the same capacitance value of capacitor 250 may not be used for different/variable slew rates.

An embodiment of a pad driver in an output buffer which addresses one or more of such problems according to various aspects of the present invention is described below.

4. Pad Driver in an Output Buffer

Figure 3:
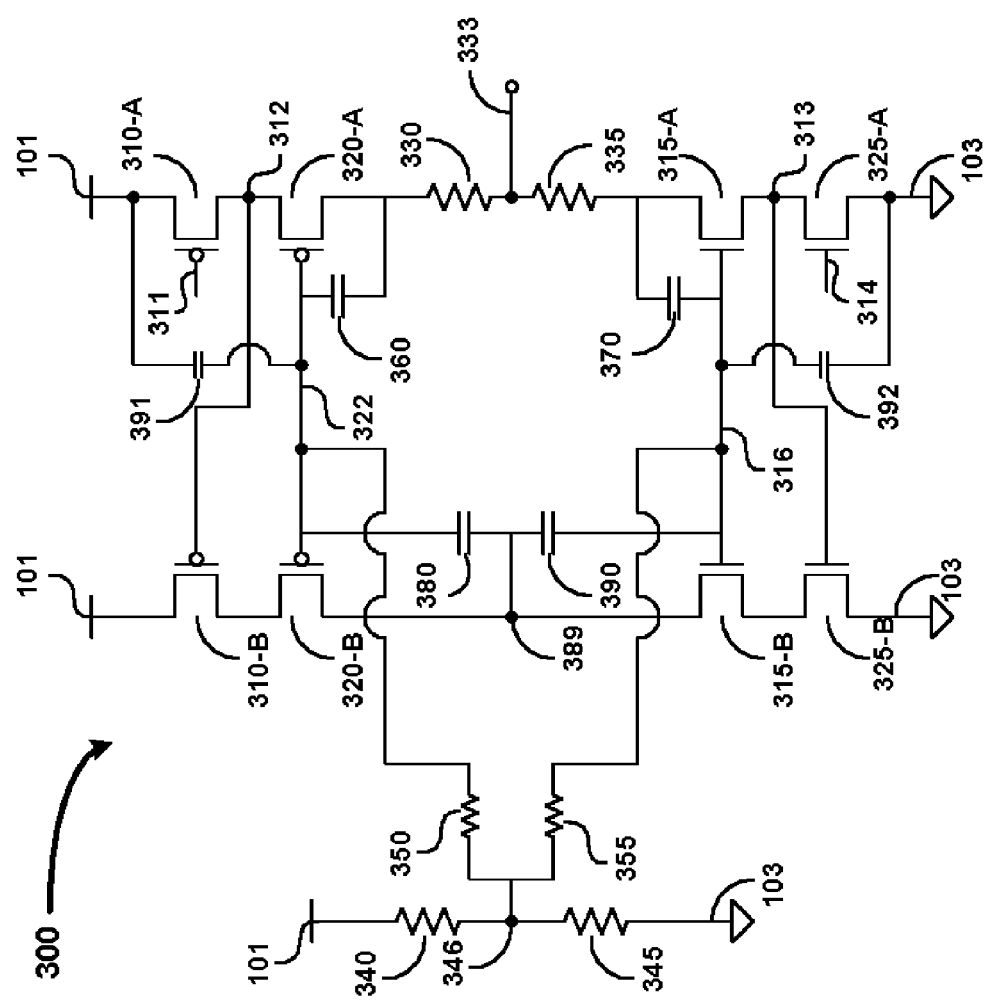
FIG. 3 is a circuit diagram illustrating the details of a pad driver in an output buffer according to various aspects of the present invention.

FIG. 3 is a circuit diagram illustrating the details of a pad driver in an output buffer in an embodiment of the present invention. For illustration, pad driver 300 is described with reference to FIG. 1. However, pad driver 300 can be implemented in other environments as well. Pad driver 150 of FIG. 1 is implemented similar to pad driver 300. Pad driver 300 is shown containing PMOS transistors 310-A, 310-B, 320-A and 320-B, NMOS transistors 315-A, 315-B, 325-A and 325-B, resistors 330, 335, 340, 345, 350 and 355 and capacitors 360, 370, 380, and 390. Each component is described in detail below.

Components 310-A, 320-A, 315-A, 325-A, 330, 335, 340, and 345 together operate similar to components 210, 220, 215, 225, 230, 235, 240, and 245 of FIG. 2. Merely for conciseness, the operation of the similar components of FIG. 2 is not repeated and the operation of the remaining components of FIG. 3 is described below.

Transistor 310-A receives high voltage supply HVDD on path 101 with reference to ground voltage Vss provided on path 103. Transistor 325-A receives ground/Vss voltage 103 on the source terminal. Gate terminals of transistors 320-A and 315-A are respectively shown receiving different reference voltages through resistors 350 and 355 on respective paths 322 and 316.

Even though different reference voltages are shown, the voltage level of Vrefp 322 may equal Vrefn 316. Providing two such voltages on different paths isolates connections of the two gate terminals from the reference voltage, which enables jitter to be reduced in the output signal which may otherwise be caused by coupling of noise/disturbance to supply voltages (HVDD and Vss). Without such isolation, jitter may be caused by application of variable voltages to transistors (due to the coupling of the noted noise/disturbance).

Capacitors 391 and 392 reduce jitter in the output signal due to noise in supply voltages. Capacitor 391 is connected between HVDD 101 and Vrefp 322 such that same noise in HVDD 101 is coupled to Vrefp 322. Since transistors 310-A and 320-A receive both HVDD 101 and Vrefp 322, the Vgs (gate to source voltage) of transistors 310-A and 320-A may not be affected due to noise in HVDD 101. Similarly, capacitor 392 is connected between Vss 103 and Vrefn 316 such that same noise in Vss 103 is coupled to Vrefn. As a result, Vgs of transistors 315-A and 325-A may not be affected due to noise in Vss 103.

Transistors 310-A and 325-A receive input signals on respective (gate terminals) paths 311 and 314 with a voltage swing lower than the voltage specification of the transistor. Paths 311 and 314 are contained in path 145 of FIG. 1 and the voltage swing is referred to as the desired voltage swing of signals generated by pre-driver 140 of FIG. 1.

Transistors 310-B, 320-B, 315-B and 325-B together operate as an inverter similar to transistors 310-A, 320-A, 315-A and 325-A. Transistor 320-B protects transistor 310-B similar to transistor 320-A from exposure to high voltages, and transistor 315-B protects transistor 320-B similar to transistor 315-A.

It may be noted that the gate terminals of transistors 310-B and 325-B are shown connected to nodes 312 and 313 respectively. Also, the signal at node 312 swings with a voltage level between (Vrefp+Vt of transistor 320-A) and HVDD 101 and the signal at node 313 swings with a voltage level between (Vrefn−Vt of transistor 325-A) and Vss 103. However, the signal on path 333 swings with a voltage level between HVDD and Vss. It may be also noted that the signal swing at nodes 312 and 313 is smaller than the signal swing on path 333. As a result, transistors 310-B and 325-B may not be exposed to high voltage across the terminals.

In addition, transistors 310-B and 325-B may not require Electro Static Discharge (ESD) protection since the gate terminals of transistors 310-B and 325-B are connected to nodes 312 and 313, which are not connected to pads. In general, it is desirable not to connect gate oxides of transistors to pads, which may otherwise destroy the gate oxides of transistors due to high external discharge. For example, if gate terminals of transistors 310-B/325-B were connected to path 333, ESD protection would be required since path 333 is used to communicate to external devices. However, since the gate terminals of transistors 310-B and 325-B are connected to nodes 312 and 313 respectively, such ESD protection may not be required.

Even though the signal swings are different at nodes 312, 313 and 333, the voltage levels represent the same logic value. For example, when input signal represents logic low, voltage HVDD is present at node 312 and on path 333, and (Vrefn−Vt) is present at node 313, all representing a logic high. On the other hand, when the input signal represents logic high, voltage (Vrefp+Vt) is present at node 312, and Vss is present on path 333 and at node 313, all representing logic low. Therefore, transistors 310-B and 325-B receive signals (respectively on nodes 312 and 313) that represent same logic level as output signal 333. The manner in which the inverted signal may be generated based on the signals at nodes 312 and 313 is described below.

Transistors 310-B, 320-B, 315-B and 325-B together generate an inverted signal at node 389. As noted above, transistors 310-B, 320-B, 315-B and 325-B together operate as an inverter on signals received at nodes 312 and 313

(which represent output signal 333), and generates inverted signal at node 389, which represents inversion of output signal 333. For example, a positive transition (logic low to high) in output signal 333 causes a negative transition (logic high to low) in the (inverted) signal generated on node 389.

Capacitors 380 and 390 couple inverted signal 389 as the corresponding compensating signal to paths 322 and 316 respectively. The manner in which such inverted signal operates as a compensating signal countering the effects of voltage coupling (due to transitions in output signal by parasitic capacitance) is described below.

As noted above, parasitic capacitors 360 and 370 respectively couple the voltage on path 333 to reference voltage on paths 322 and 316 when output signal 333 switches from one logic value to another logic value. De-coupling capacitors 380 and 390 counter the effect of the voltage coupling (of transitions at path 333) on Vrefp 322 and Vrefn 316 respectively by pulling the voltage on paths 322 and 316 in opposite voltage direction to that pulled by capacitors 360 and 370 as described in further detail below.

When output signal 333 switches from logic low to logic high, inverted signal at node 389 (to which one end of each capacitor 380 and 390 is connected) switches from logic high to logic low. Capacitors 360 and 370 respectively couple the voltage level representing logic high to Vrefp 322 and Vrefn 316. Such coupled voltage level may cause the reference voltage on paths 322 and 316 to rise higher. Capacitors 380 and 390 operate to pull down the rising voltage, as described below.

Capacitors 380 and 390 respectively couple inverted signal 389 at logic low as compensating signal on paths 322 and 316. The logic low level of compensating signal pulls the voltage level on paths 322 and 316 towards logic low. As a result, the voltage levels on paths 322 and 316 may remain substantially constant since the compensating signal pulls the node in the opposite voltage level direction compared to the coupling effect of the output signal. Similarly, capacitors 380 and 390 couple inverted signal 389 as compensating signal to counter the effect of voltage coupling when output signal on path 333 switches to logic low.

In an embodiment, the capacitances of capacitors 380 and 390 are respectively selected equaling the capacitances of capacitors 360 and 370. The parasitic capacitance can generally be determined based on various parameters used in fabrication of the IC. As a result, the countering effect may be substantially equal in magnitude but opposite in polarity (or pulling direction), which causes the voltage levels on paths 322 and 316 to respectively equal Vrefp and Vrefn.

It may be noted that capacitors 380 and 390 can be implemented using small capacitors (than capacitor 250 of FIG. 2) since the capacitance value merely needs to equal the parasitic capacitance of transistors 320-A and 315-B. In one embodiment, the size of each of capacitors 380 and 390 is smaller than the size of capacitor 250 (of the prior art of FIG. 2) by more than 10 times, thereby leading to reduced area on an integrated circuit.

In addition, it is empirically recognised that the size of capacitors 380 and 390 (and thus a circuit design) is independent of the slew rate (the speed of transition) of output signal 333 since capacitance of capacitors 380 and 390 are designed to be equal to the capacitance of capacitors 360 and 370. As a result, area and cost of an output buffer (pad driver) may be reduced.

In addition, the size of transistors 310-B, 320-B, 315-B and 325-B is smaller than that of transistors 310-A, 320-A, 315-A and 325-A since transistors 310-B, 320-B, 315-B and 325-B need not drive an external load, and accordingly the additional area requirements may also be minimal. Furthermore, the solution can be integrated easily into designs related to low voltage transistors operating in high voltage environments since each of PMOS transistors 310-A, 310-B, 320-A and 320-B, NMOS transistors 315-A, 315-B, 325-A and 325-B is implemented using low voltage transistors.

Therefore, due to the compensation signal provided according to various aspects of the present invention, the effect of voltage coupling on the reference voltages due to switching at the output of output buffer is reduced, which in turn reduces jitter in the output signal. The manner in which the coupling effect/jitter may be reduced compared to prior output buffer 200 is described below with reference to FIGS. 4, 5A and 5B.

5. Timing Diagram

Figure 4:
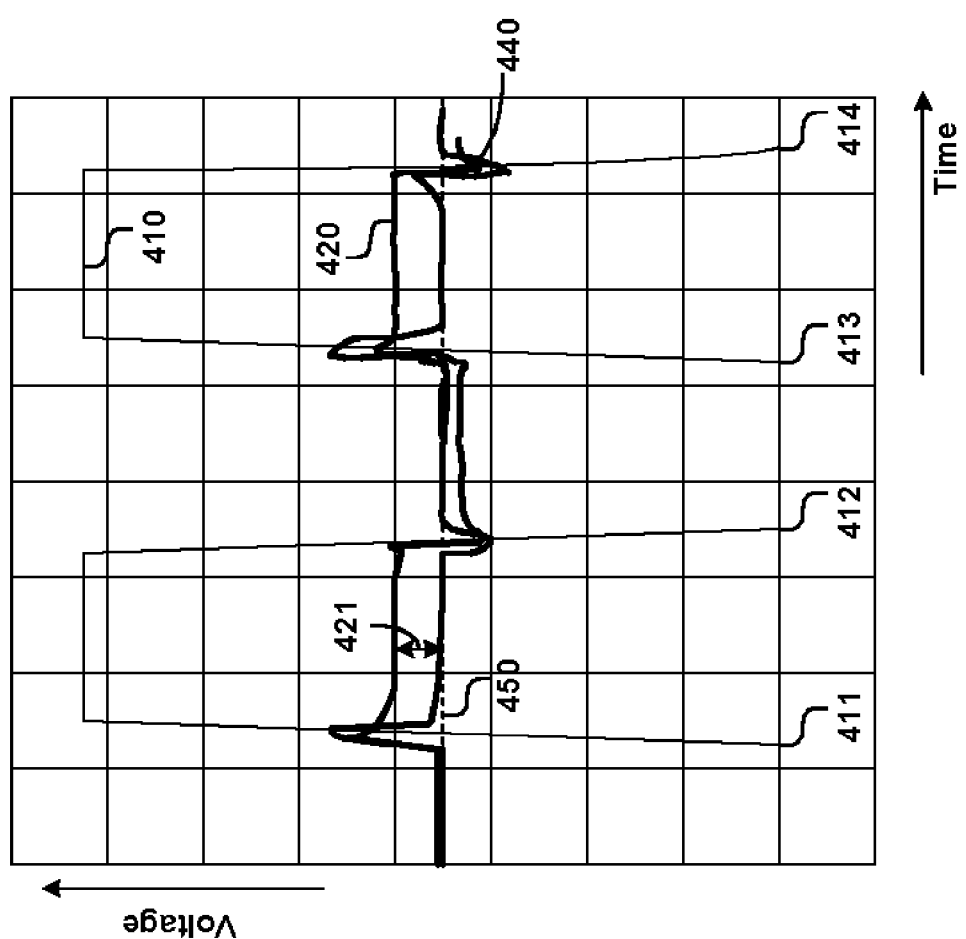
FIG. 4 is a timing diagram of a reference signal generated by a prior embodiment and a reference signal generated in an embodiment of the present invention, illustrating the manner in which the effect of coupling is reduced according to various aspects of the present invention.

FIGS. 4, 5A and 5B are timing diagrams comparing the operation of prior pad driver 200 and pad driver 300 in an embodiment. In particular, FIG. 4 is a timing diagram illustrating the details of coupling effect in prior pad driver 200 and in an embodiment of the present invention, FIGS. 5A and 5B respectively illustrate jitter in the output signals generated by pad driver 200 and pad driver 300. For illustration, the timing diagrams are described with reference to FIGS. 2 and 3.

With reference to FIG. 4, lines 410, 420, 440 and 450 respectively represent output signal on path 333, reference voltage in pad driver 200, reference voltage in pad driver 300, and the voltage level of desired reference voltage. Line 410 is shown transitioning at time points 411, 412, 413 and 414. Line 450 shown with broken lines represents the (ideal/desired) voltage level of a reference voltage applied to the gate terminals of transistors when not affected by transitions.

Line 420 is shown rising from reference voltage level 450 at time point 411 (due to voltage coupling), and is shown falling to other voltage level in a short duration after time point 411 and staying at the same voltage level during logic high of output signal 410. It may be observed that the change in the reference voltage due to voltage coupling is more at transition (time point 411) and less (shown as 421) after transition.

It may be noted that, the change in the reference voltage during transition is not settling back to the same voltage level 450 after transition in case of prior pad driver 200. Line 440 illustrates the change in the reference voltage in case of pad driver 300 in an embodiment of the present invention.

Line 440 is shown rising from reference voltage level 450 at time point 411 (due to voltage coupling), and is shown falling back to same reference voltage level 450 in a short duration after time point 411. Line 440 is shown staying at the same voltage level during logic high of output signal 410. Inverted signal at node 389 of FIG. 3 pulls back the change in the reference voltage level to initial value 450. It may be observed that the change in the reference voltage due to voltage coupling is more at transition (time point 411) and settles to the same voltage level as before transition in a short time duration.

Therefore, the effect of coupling due to the transitions in the output signal may be reduced substantially according to various aspects of the present invention. Due to such reduction of coupling effect, jitter in the output signal may also be reduced. The reduction in jitter is illustrated with reference to FIGS. 5A and 5B below.

FIGS. 5A and 5B are timing diagrams illustrating the details of reduction in jitter in the output signal of prior pad driver 200 and pad driver 300 respectively for same input signals. Line 510 of FIG. 5A represents output signals generated by pad driver 200 in successive cycles of input signal. However, all the output signals in successive cycles are drawn in same time duration for illustration. Similarly, line 550 of FIG. 5B represent all the output signals generated by pad driver 300 in successive cycles, shown in same time duration.

The thickness of lines 510/550 represent the amount of jitter in the output signal. The variation in the output signal from one transition to the other transition is referred to as jitter. More the change in the output signal across successive cycles, more thick is line 510/550 (and thus more jitter in the output signal). It may be observed that line 510 is thicker than line 550. Therefore, the jitter in the output signal generated by pad driver 300 is less than that of prior pad driver 200.

Thus, output buffers provided according to features described above may be implemented in various types of devices. An example device is described below in detail.

6. Example Device

Figure 6:
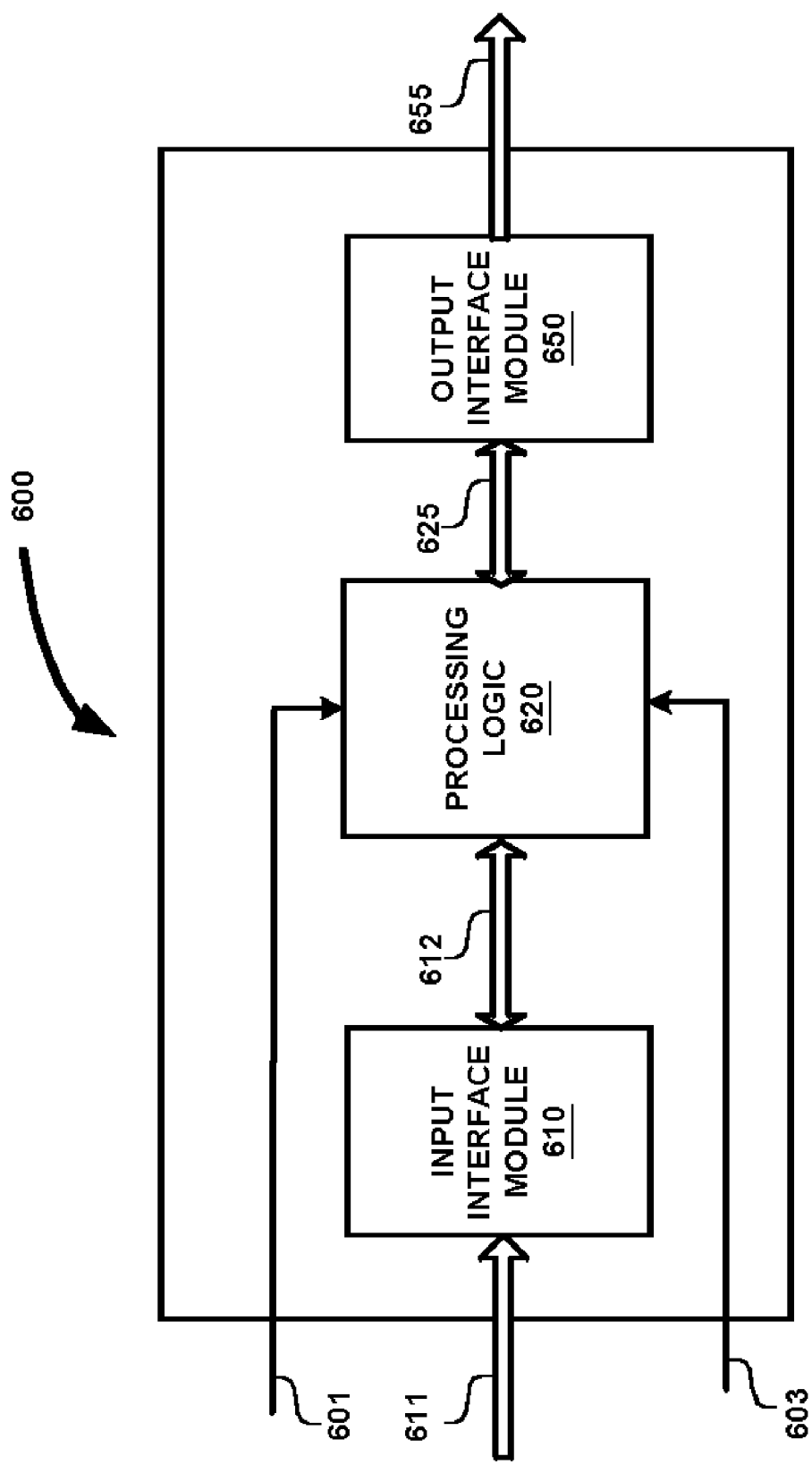
FIG. 6 is a block diagram illustrating an example device in which various aspects of the present invention can be implemented.

FIG. 6 is a block diagram illustrating an example device in which various aspects of the present invention can be implemented. Example device 600 is shown containing input interface module 610, processing logic 620 and output interface module 650. Each block is described below.

Input interface module 610 may provide a suitable interface to receive input signals from various external sources. Examples of such external sources include other devices as well components such as keyboards, networks, etc. The signals may be received on path 611 and provided in a suitable format on path 612 (after any desired processing). Similarly, output interface module 650 provides a suitable interface to transfer the signals received on path 625 to external sources (e.g., other devices, display unit, networks, etc.) on path 655.

Processing logic 620 processes the signals received on path 612 and provides the output signals to be transmitted to external device(s) on path 625. Processing logic 620 may be implemented with low voltage transistors operating with a high voltage supply received on path 601. The voltage level of supply voltage 601 is referred with reference to a ground voltage Vss received on path 603. Processing logic 620 can be implemented using the various techniques described above with reference to integrated circuit 100 of FIG. 1, and thus may contain all or portion of integrated circuit 100.

7. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

The invention claimed is:

1. An output buffer generating an output signal having a swing equaling a first voltage level, said output buffer comprising:

a first transistor and a second transistor together operating as a first inverter, each of said first transistor and said second transistor being of a voltage specification of a second voltage level, wherein said second voltage level is lower than said first voltage level;

a third transistor (320-A) and a fourth transistor protecting said first transistor and said second transistor from exposure to said first voltage level, wherein each of said first transistor, said second transistor, said third transistor, and said fourth transistor contains a source terminal, a drain terminal, and a gate terminal, the source terminal of said third transistor is coupled to the drain terminal of said first transistor at a fourth node, the gate terminal of said third transistor is coupled to a reference voltage at a first node, the drain terminal of said third transistor is coupled to the drain terminal of said fourth transistor, the source terminal of said fourth transistor is coupled to the drain terminal of said second transistor at a fifth node, the gate terminal of said fourth transistor is coupled to said reference voltage at a second node, the gate terminal of said first transistor is coupled to receive a first input swing signal, the gate terminal of said second transistor is coupled to receive a second input swing signal, each of said first input swing signal and said second input swing signal having a lower swing than said first voltage level, the source terminal of said second transistor is coupled to receive a ground voltage, the source terminal of said first transistor is coupled to receive a supply voltage of said first voltage level, a parasitic capacitance of said third transistor and said fourth transistor coupling said output signal to said first node and said second node respectively; and a second inverter, a first capacitor, and a second capacitor together countering the effect of coupling of said output signal to said first node and to said second node, said second inverter generating an inverted signal of said output signal at a sixth node, said first capacitor connecting said inverted signal to said first node, and said second capacitor connecting said inverted signal to said second node.

2. The output buffer of claim 1, wherein said second inverter comprises:

a fifth transistor (310-B) and a sixth transistor (325-B) together performing an inverting operation on said output signal; and a seventh transistor and a eighth transistor protecting said fifth transistor and said sixth transistor from exposure to said first voltage level, wherein said fifth transistor, said sixth transistor, said seventh transistor and said eighth transistor is of a voltage specification of said second voltage level, each of said fifth transistor, said sixth transistor, said seventh transistor, and said eighth transistor contains a source terminal, a drain terminal, and a gate terminal, the source terminal of said seventh transistor is coupled to the drain terminal of said fifth transistor, the gate terminal of said seventh transistor is coupled to said first node, the drain terminal of said seventh transistor is coupled to the drain terminal of said eighth transistor at said sixth node, the source terminal of said fifth transistor is coupled to receive said supply voltage, the source terminal of said eighth transistor is coupled to the drain terminal of said sixth transistor, the gate terminal of said eighth transistor is coupled to said second node, the source terminal of said sixth transistor is coupled to receive a ground voltage, the gate terminal of said fifth transistor is coupled to said fourth node, the gate terminal of said sixth transistor is coupled to said fifth node.

3. The output buffer of claim 2, further comprises:

a first resistor and a second resistor connected in series to operate as a potential divider network to generate a source reference voltage at a seventh node;

a third resistor connected between said seventh node and said first node to provide said source reference voltage as said reference voltage at said first node; and a third resistor connected between said seventh node and said second node to provide said source reference voltage as said reference voltage at said second node.

4. The output buffer of claim 3, further comprises:

a fifth resistor connected between the drain terminal of said third transistor and an output path; and a sixth resistor connected between the drain terminal of said fourth transistor and said output path, wherein each of said fifth resistor and said sixth resistor provides linear impedance to reduce jitter in said output signal.

5. The output buffer of claim 4, wherein each of said first transistor, said third transistor, said fifth transistor and said seventh transistor comprises a PMOS transistor, and each of said second transistor, said fourth transistor, said sixth transistor and said eighth transistor comprises a NMOS transistor.

6. The output buffer of claim 5, wherein each of said reference voltages provided to said first node and said second node approximately equals half of said first voltage level.

7. The output buffer of claim 1, wherein a capacitance of said first capacitor equals the parasitic capacitance of said third transistor and a capacitance of said second capacitor equals the parasitic capacitance of said fourth transistor.

8. An article of manufacture processing input data, said article of manufacture comprising:

a core module performing operations on said input data to generate a core output;

a pre-driver receiving said core output to generate a first swing signal and a second swing signal, each having a swing lower than a first voltage level; and a pad driver generating an output signal of said first voltage level, said pad driver comprising:

a first transistor and a second transistor together operating as a first inverter, each of said first transistor and said second transistor containing a source terminal, a gate terminal and a drain terminal, the gate terminal of said first transistor receiving said first swing signal and the gate terminal of said second transistor receiving said second swing signal, each of said first transistor and said second transistor being of a voltage specification of a second voltage level;

a third transistor and a fourth transistor protecting said first transistor and said second transistor from exposure to said first voltage level, each of said third transistor and said fourth transistor containing a source terminal, a gate terminal and a drain terminal, the gate terminal of each of said third transistor and said fourth transistor being coupled to receive a reference signal, a parasitic capacitance of said third transistor and said fourth transistor coupling said output signal to said reference signal; and a second inverter and a first capacitor together countering the effect of coupling of said output signal to said reference signal, said second inverter generating an inverted signal of said output signal, said first capacitor connecting said inverted signal to said reference signal.

9. The article of manufacture of claim 8, wherein a source reference signal is coupled as said reference signal to each of the gate terminal of said third transistor and the gate terminal of said fourth transistor, wherein said first capacitor couples said inverted signal to the gate terminal of said third transistor and a second capacitor couples said inverted signal to the gate terminal of said fourth transistor.

10. The article of manufacture of claim 9, wherein a capacitance of said first capacitor equals the parasitic capacitance of said third transistor and a capacitance of said second capacitor equals the parasitic capacitance of said fourth transistor.

11. The article of manufacture of claim 10, wherein each of said first transistor and said third transistor comprises a PMOS transistor, and each of said second transistor and said fourth transistor comprises a NMOS transistor.

12. The article of manufacture of claim 11, wherein each of said reference voltages provided to the gate terminal of said third transistor and the gate terminal of the fourth transistor approximately equals half of said first voltage level.

* * * * *